United States Patent
Kraus et al.

(10) Patent No.: US 10,161,983 B2
(45) Date of Patent: Dec. 25, 2018

(54) METHOD AND SYSTEM FOR HOT SOCKET DETECTION IN A UTILITY METER

(71) Applicant: Landis+Gyr LLC, Lafayette, IN (US)

(72) Inventors: Matthew Eric Kraus, Jamestown, IN (US); Frank J. Boudreau, Jr., Otterbein, IN (US)

(73) Assignee: Landis+Gyr LLC, Lafayette, IN (US)

( * ) Notice: Subject to any disclaimer, the term of this patent is extended or adjusted under 35 U.S.C. 154(b) by 0 days.

(21) Appl. No.: 15/271,303

(22) Filed: Sep. 21, 2016

(65) Prior Publication Data
US 2018/0080970 A1     Mar. 22, 2018

(51) Int. Cl.
| | | |
|---|---|---|
| G01R 31/04 | (2006.01) | |
| G01R 15/18 | (2006.01) | |
| G01R 21/00 | (2006.01) | |
| G01R 22/06 | (2006.01) | |
| G01R 35/00 | (2006.01) | |
| G01R 31/02 | (2006.01) | |
| G01R 31/12 | (2006.01) | |

(52) U.S. Cl.
CPC ............ *G01R 31/04* (2013.01); *G01R 15/18* (2013.01); *G01R 21/00* (2013.01); *G01R 22/068* (2013.01); *G01R 31/027* (2013.01); *G01R 31/1272* (2013.01); *G01R 35/00* (2013.01)

(58) Field of Classification Search
USPC .......................................... 324/142, 537, 522
See application file for complete search history.

(56) References Cited

U.S. PATENT DOCUMENTS

| | | | | |
|---|---|---|---|---|
| 2,294,759 A | * | 9/1942 | Morack ..................... | G05F 1/00 |
| | | | | 315/102 |
| 4,217,545 A | * | 8/1980 | Kusui .................. | G01R 21/127 |
| | | | | 324/107 |
| 4,491,790 A | | 1/1985 | Miller | |
| 4,535,287 A | * | 8/1985 | Milkovic ............. | G01R 21/133 |
| | | | | 324/107 |

(Continued)

FOREIGN PATENT DOCUMENTS

| | | | |
|---|---|---|---|
| CN | 203535472 U | * | 4/2014 |
| EP | 0330045 A2 | | 9/1989 |

OTHER PUBLICATIONS

International Search Report and Written Opinion of corresponding PCT Application No. PCT/US2017/052698, dated Dec. 15, 2017.

*Primary Examiner* — Vincent Q Nguyen

(74) *Attorney, Agent, or Firm* — Kilpatrick Townsend & Stockton LLP

(57) ABSTRACT

An arrangement for use in a utility meter includes a transformer, a voltage source, a sensor, and a processor. The transformer includes a primary winding, a first secondary winding, and a second secondary winding. The voltage source is operably connected to generate a voltage signal and to provide the voltage signal to the first secondary winding. The generated voltage signal has a corresponding current formed at least in part by an impedance defined in part by a permeability of the transformer. The sensor is operably connected to generate a permeability signal indicative of the corresponding current. The processor is operably connected to the sensor and is configured to generate a hot socket detection signal responsive to the permeability signal indicating that the permeability of the transformer has fallen below a threshold value.

6 Claims, 7 Drawing Sheets

(56) References Cited

U.S. PATENT DOCUMENTS

| | | | | |
|---|---|---|---|---|
| 4,775,828 A | * | 10/1988 | Watley | G01R 21/133 |
| | | | | 322/25 |
| 4,843,310 A | | 6/1989 | Friedl | |
| 2005/0093537 A1 | | 5/2005 | Townsend et al. | |
| 2012/0091924 A1 | * | 4/2012 | Tran | H05B 41/295 |
| | | | | 315/362 |
| 2013/0226485 A1 | * | 8/2013 | Pietrowicz | G01R 1/20 |
| | | | | 702/62 |
| 2014/0327449 A1 | | 11/2014 | Shuey et al. | |

* cited by examiner

US 10,161,983 B2

METHOD AND SYSTEM FOR HOT SOCKET DETECTION IN A UTILITY METER

FIELD

This disclosure relates to the field of utility meters, and particularly, to monitoring the operating condition of a utility meter.

BACKGROUND

Utility meters are devices that, among other things, measure the consumption of a utility-generated commodity, such as electrical energy, gas, or water, by a facility, such as a residence, a factory, or a commercial establishment. Utility service providers employ utility meters to track customer usage of the utility-generated commodities for reasons including billing and demand forecasting of the commodity.

Electricity meters are utility meters configured to measure quantities related to the consumption of electrical energy by a facility or other load. In some instances, the electricity meter is received by a socket that is electrically connected to the utility-generated power source and to the electrical load of a customer. Electricity passes through current coils of the electricity meter as it flows from the power source to the customer's electrical load. The electricity meter monitors the total amount of electrical energy that is provided to the load via the current coils.

One type of undesirable condition in a meter and socket is known as a "hot socket." A "hot socket" occurs when the socket that receives the electricity meter ceases to efficiently transfer electrical energy from the source to the electricity meter. In particular, as the socket ages, jaws within the socket may lose spring tension, such that a less reliable electrical connection exists between the socket and the electricity meter. Under certain conditions, the less reliable connection may cause micro-arcing between the socket and the electricity meter, which undesirably results in an increase in temperature of the socket and the electricity meter. If the socket and the electricity meter are subject to the hot socket condition for an extended time period, then damage may result to at least one of the socket and the electricity meter and the customer is likely to experience a service interruption. In addition, the heat from the hot socket represents $I^2R$ loss, which is inefficient. As a result, customers desire early and accurate detection of the hot socket condition so that time is available for a technician to take mitigating steps to correct the problem to avoid losses and/or an unplanned service interruption.

Methods and systems for detecting the hot socket condition are known, including sensors that detect heat in the area of the coil. However, these methods are not always as reliable as desired because the results can be easily misinterpreted. For example, it is difficult for most systems to differentiate between the hot socket condition and the large temperature rise that occurs from natural environmental conditions, such as solar loading. Solar loading, which has nothing to do with the hot socket condition, is where the electricity meter experiences a significant increase in temperature due to direct sunlight. Misinterpretation of the results of known methods and system for detecting the hot socket condition causes customer dissatisfaction due to the possibility of an unplanned electrical service interruption.

Thus, a continuing need exists to increase the performance of utility meters so that the utility service provider is able to accurately and reliably determine the operating state of the utility meter and, in particular, whether or not an electricity meter is presently experiencing the hot socket condition.

SUMMARY

According to an exemplary embodiment of the disclosure, an arrangement for use in a utility meter comprises a transformer, a voltage source, a sensor, and a processor. The transformer includes a primary winding, a first secondary winding, and a second secondary winding. The voltage source is operably connected to generate a voltage signal and to provide the voltage signal to the first secondary winding. The generated voltage signal has a corresponding current formed at least in part by an impedance defined in part by a permeability of the transformer. The sensor is operably connected to generate a permeability signal indicative of the corresponding current. The processor is operably connected to the sensor and is configured to generate a hot socket detection signal responsive to the permeability signal indicating that the permeability of the transformer has fallen below a threshold value.

According to another exemplary embodiment of the disclosure, a method of operating a utility meter comprises supplying a first secondary winding of a transformer with a voltage signal; monitoring either the first secondary winding or a second secondary winding of the transformer for a signal corresponding to the voltage signal; generating a sensor signal based on the signal corresponding to the voltage signal, the sensor signal indicative of a permeability of the transformer; and generating a hot socket detection signal responsive to the permeability of the transformer falling below a threshold value as indicated by the sensor signal.

BRIEF DESCRIPTION OF THE FIGURES

The above-described features and advantages, as well as others, should become more readily apparent to those of ordinary skill in the art by reference to the following detailed description and the accompanying figures in which.

DETAILED DESCRIPTION

Figure 1:
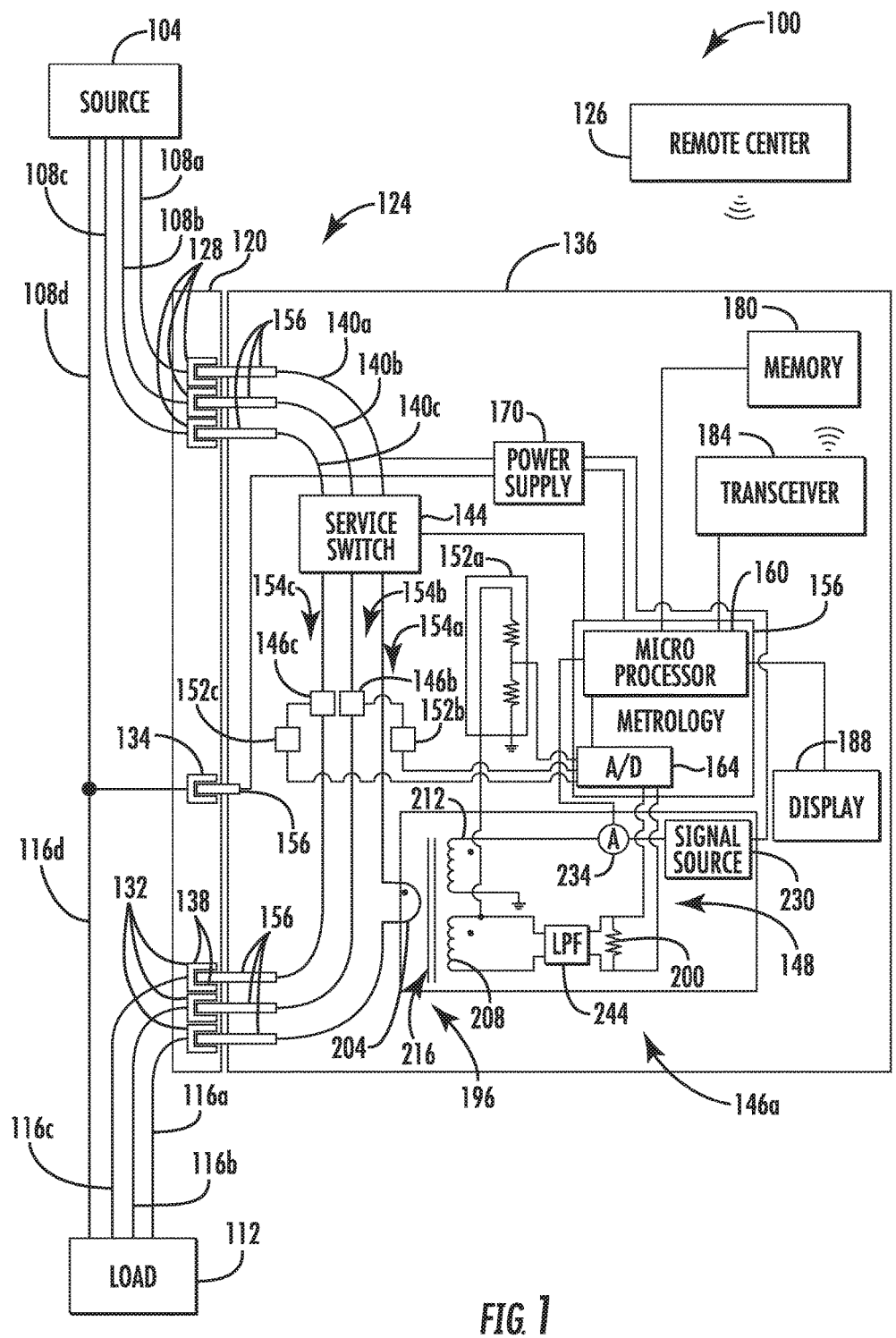
FIG. 1 is a schematic block diagram illustrating an exemplary metering system including a utility meter having a hot socket detection system.

For the purpose of promoting an understanding of the principles of the disclosure, reference will now be made to the embodiments illustrated in the drawings and described in the following written specification. It is understood that no limitation to the scope of the disclosure is thereby intended. It is further understood that this disclosure includes any alterations and modifications to the illustrated embodiments and includes further applications of the principles of the disclosure as would normally occur to one skilled in the art to which this disclosure pertains.

As shown in FIG. 1, a metering system 100 includes an electrical energy source 104 and an electrical load 112, each electrically connected to a utility meter 124. The metering system 100 further includes a remote center 126 in wireless electrical communication with the utility meter 124. In an alternative embodiment, the utility meter 124 and the remote center 126 may be connected via a wired connection, including but not limited to one that includes the power lines 108a, 108b, 108c.

As disclosed in detail herein, the utility meter 124 includes a hot socket detection system 148 that is configured to identify phenomena indicative of a hot socket condition, including those in which a temperature of the utility meter 124 exceeds a threshold temperature level. When the hot socket detection system 148 detects the hot socket condition, the utility meter 124 is configured, in one embodiment, to send a hot socket detection signal to the remote center 126 so that mitigating steps can be taken to prevent or to minimize damage to the metering system 100 and to prevent or to minimize service disruptions to the load 112. The components of the metering system 100 are described below in detail.

The source 104 is a source of electrical energy and is also referred to herein as a utility service provider, an electrical service provider, or a utility. The electrical energy is typically provided in the form of an AC voltage exceeding one hundred volts, and having an alternating frequency of 50 Hz or 60 Hz. In one embodiment, the source 104 includes a transformer (not shown) that is electrically connected to a power plant and associated distribution system (not shown) to receive electrical energy. The source 104 typically scales the electrical energy to a level that is suitable for use with the load 112 and the utility meter 124. In the illustrated embodiment, the source 104 provides the AC power lines 108a, 108b, 108c a three-phase four-wire service, which is well known in the art. However, the source 104 may additionally or alternatively provide electrical energy in any desired electrical service or configuration as required by the load 112 and the utility meter 124, such as single-phase electrical energy.

The load 112 is an electrical load that consumes electrical energy from the source 112. The load 112 is illustrated as a consumer of three-phase four-wire electrical energy; however, in other embodiments the load 112 is configured to consume any configuration of electrical energy, such as single-phase electrical energy.

The remote center 126 is electrically connected to the utility meter 124 and is configured to receive electrical data from the utility meter 124 and to send electrical data to the utility meter 124. The remote center 126 is configured to monitor the status of the utility meter 124, as described in detail herein.

The utility meter 124 is electrically connected to the source 104 and to the electrical load 112 through electrical power lines 108a, 108b, 108c, electrical load lines 116a, 116b, 116c, and neutral lines 108d, 116d. The electrical power lines 108a, 108b, 108c conduct electrical energy from the source 104 to the utility meter 124. The electrical load lines 116a, 116b, 116c, in turn, conduct electrical energy from the utility meter 124 to the load 112. To this end, the system 100 includes a meter mounting device 120, which provides an interface to the load lines 116a, 116b, 116c and the power lines 108a, 108b, 108c, as will be discussed in further detail below. The utility meter 124 is configured to measure the consumption of electrical energy by the load 112.

The exemplary embodiment described herein involves a three-phase, four-wire electrical service, as is known in the art. As a consequence, the power lines 108a, 108b, 108c include a phase A power line 108a, a phase B power line 108b, a phase C power line 108c, and neutral line 108d. Likewise, the load lines 116a, 116b, 116c include a phase A load line 116a, a phase B load line 116b, a phase C load line 116c, and a neutral line 116d. Each of the load lines 116a, 116b, 116c is coupled to the corresponding power line 108a, 108b, 108c via the meter 124 through the mounting device 120.

With reference to FIG. 1, the utility meter 124 includes a housing 136 that is mounted to the mounting device 120. The illustrated mounting device 120 includes three line-side sockets 128 physically and electrically connected to the power lines 108a, 108b, 108c, and three load-side sockets 132 physically and electrically connected to the load lines 116a, 116b, 116c. The mounting device 120 also includes a neutral line socket 134 coupled to the neutral lines 108d, 116d. The sockets 128, 132, 134 are formed from conductive metal and are configured to withstand high currents and voltages. In one embodiment, the sockets 128, 132, 134 are generally "U"-shaped and include arms 138, as shown in FIG. 1. The sockets 128, 132, 134 are spring tensioned, such that the arms 138 are biased towards each other to encourage reliable electrical contact with the corresponding portions of the housing 136 (i.e. blades 156). The detailed structure of the sockets 128, 132 and 134 would be known to those of ordinary skill in the art and are dictated at least in part by ANSI standards. In other embodiments, the mounting device 120 includes any suitable number and configuration of sockets 128, 132, 134, as may be determined by the electrical power demands of the load 112.

The housing 136 of the utility meter 124 is configured to contain and support current coils 140a, 140b, 140c, a service switch 144, current sensor subsystems 146a, 146b, 146c, the hot socket detection system 148, voltage sensors 152a, 152b, 152c, a metrology unit 156 including a microprocessor 160 and an A/D converter 164, a power supply 170, a memory 180, a transceiver 184, and a display 188. In this embodiment, the current coils 140a, 140b, 140c correspond to the phase A power line 108a, the phase B power line 108b, and the phase C power line 108c, respectively. The current coils 140a, 140b, 140c are electrical conductors (e.g. copper conductors) that are located at least partially within the housing 136 and are configured for electrical connection to the power lines 108a, 108b, 108c and the load lines 116a, 116b, 116c. Each current coil 140a, 140b, 140c is configured to couple the corresponding power line 108a, 108b, 108c to the respective load line 116a, 116b, 116c, via the sockets 128, 132. The current coils 140a, 140b, 140c, the power lines 108a, 108b, 108c, and the load lines 116a, 116b, 116c, thereby define three circuit paths 154a, 154b, 154c for carrying electrical energy between the source 104 and the load 112.

Each respective current coil 140a, 140b, 140c includes two blades 156, which are configured to partially extend from the housing 136. The blades 156 are configured to provide a mechanically and electrically sound connection between the current coils 140a, 140b, 140c and the sockets

128, 132. In particular, each blade 156 is positioned between the arms 138 of a respective one of the sockets 128, 138. Moreover, in some embodiments, the current coils 140a, 140b, 140c and the blades 156 are configured to mechanically support the utility meter 124 in a mounted position (as shown in FIG. 1) on the mounting device 120. A blade 156 is also included to connect the utility meter 124 to the socket 134 of the neutral lines 108d, 116d.

As discussed above, the present embodiment of the meter 124 includes an optional service switch 144. The service switch 144, which is shown in the illustrated embodiment as a three phase service switch, is operably coupled to the circuit paths 154a, 154b, 154c and to the metrology unit 156 and is configurable in a closed state (first operating state) and an open state (second operating state). In the closed state, the service switch 144 is configured to form a closed circuit in each of the circuit paths 154a, 154b, 154c, which enables electrical energy transfer from the source 104 to the load 112 through the current coils 140a, 140b, 140c. In a three-phase system all three line voltages are applied to the load 112 when the three-phase service switch 144 is in the closed state. In the open state, the service switch 144 is configured to form an open circuit in the circuit paths 154a, 154b, 154c, which prevents electrical energy transfer from the source 104 to the load 112 through the current coils 140a, 140b, 140c. In a three phase system all three line voltages are isolated from the load 112 when the three-phase service switch 144 is in the open state. The service switch 144 is configured to open or to close all three phases at once in order to prevent damage to the load 112; accordingly, the service switch 144, in this embodiment, is typically not configured to offer individual line voltage control or individual phase control.

The current sensor subsystems 146a, 146b, 146c are disposed on the circuit paths 154a, 154b, 154c in a current sensing relationship with respect to the current coils 140a, 140b, 140c. In general, one function of the current sensor subsystems 146a, 146b, 146c is to generate a current measurement signal representative of the waveform on each respective current coil 140a, 140b, 140c, and to provide that current measurement signal to the A/D converter 164. In accordance with an embodiment of the invention, each of the current sensor subsystems (e.g. subsystem 146a) includes a corresponding hot socket detection circuit (e.g. circuit 148) that is configured to generate a signal representative of the detection of a potential hot socket condition on one of the corresponding blade/socket connections (e.g. 128/156 or 132/156).

In order to generate the current measurement signal, the current sensor subsystem 146a includes a transformer 196 and a burden resistor 200. The transformer 196 includes a primary winding 204, a secondary winding 208, and an auxiliary secondary winding 212 operably connected to a core 216. In the illustrated embodiment, the primary winding 204 is formed by all or part of the current coil 140a. The secondary windings 208, 212 are configured to generate a scaled version of the current/voltage passing through the primary winding 204 (i.e. the current coil 140a). In one embodiment, the secondary winding 208 has ten times the number of turns as the auxiliary secondary winding 212. The core 216 of the transformer 196 in this embodiment is a magnetic core having a magnetic permeability. The permeability of the core 216 is based on the temperature of the transformer 196, as described herein. The auxiliary secondary winding 212 is part of the hot socket detection circuit 148 as discussed below.

The burden resistor 200 is operably connected to the secondary winding 208. All or most of the current in the secondary winding 208 flows through the burden resistor 200. Therefore, the voltage dropped across the burden resistor 200 is referred to herein as a current measurement signal $I_M$ of the secondary winding 208. An exemplary value of the burden resistor 200 is approximately one megaohm (1 MΩ).

The hot socket detection circuit 148 includes the auxiliary secondary winding 212, a signal source 230, a sensor 234, and a low-pass filter 244. The signal source 230 is a device configured to generate a periodic voltage signal having a frequency exceeding that of the AC line voltage. The signal source 230 is operably connected to provide the voltage signal to the auxiliary secondary winding 212. The generated voltage signal has a corresponding current formed at least in part by an impedance defined by the permeability of the transformer. The sensor 234 is operably connected to generate a permeability signal indicative of the corresponding current. In this embodiment, the sensor 234 generates the permeability signal by measuring the current between the signal source 230 and the auxiliary second winding 212, and generating a signal indicative of the current. The permeability signal is indicative of a permeability of the transformer 196.

In addition, the low pass filter 244, in this embodiment, is included to effectively eliminate the injected voltage signal from the measurement signal generated by the burden resistor 200. To this end, the low pass filter 244 is operably connected to provide low pass filtering of the signal generated by the secondary winding 208 and to provide the filtered signal to the burden resistor 200. The burden resistor 200 thus generates the current measurement signal $I_M$ of the secondary winding 208 relatively free of any influence of the signal injected by the signal source 230.

Thus, the current sensor subsystem 146a generates two outputs: the current measurement signal $I_M$ of the secondary winding 208, and the permeability signal generated by the sensor 234. The current sensor subsystem 146a is operably coupled to provide the current measurement signal $I_M$ to the A/D converter 164 and to provide the permeability signal to the microprocessor 160.

The A/D converter 164 is operably coupled to receive the current measurement signal $I_M$ and is configured to convert the current measurement signal $I_M$ into a digital current value that is representative of the current in the secondary winding 208. Using a ratio including the number of turns of the secondary winding 208 and the number of turns of the primary winding 204, the metrology 156 is configured to convert the digital current value into another digital value that represents the current flowing through the circuit path 154a. In this way, the current sensor subsystem 146a is configured to sense the current in the current coil 140a. In some embodiments, the A/D converter 164 is also considered a voltage sensor that is configured to sense the voltage that is dropped across the burden resistor 200.

As mentioned above, the current sensor subsystems 146b and 146c may suitably have the same structure and operation as the current sensor subsystem 146a.

The voltage sensor 152a in this embodiment is a voltage divider operably coupled to divide the voltage signal present on the current coil 140a. The voltage sensor 152a is operably coupled to provide the divided voltage signal, which is the voltage measurement signal for the phase A power line 108a, to the A/D converter 164. The voltage sensors 152b and 152c may have a similar structure and provide corresponding analog voltage measurement signals for the phase B and phase C power lines 108b, 108c, respectively. The A/D converter 164 generates digital measurements signals that constitute sampled versions of the voltage measurements signals received from the voltage sensors 152a, 152b, and 152c.

In general, the microprocessor 160 receives the digital voltage and current measurement signals from the A/D converter 164 and generates energy consumption signals therefrom using any of a set of known energy calculation methods. In addition, the microprocessor 160 is configured to generate a hot socket detection signal responsive to the permeability signal indicating that the permeability of the transformer 196 has fallen below a threshold value. For example, if the permeability signal indicates a current over a predetermined threshold, then it is indicative of a reduced permeability and possible hot socket condition. Further detail of the operations of the microprocessor 160 in connection with a particular embodiment of the hot socket detection circuit 148 is discussed further below.

Figure 2:
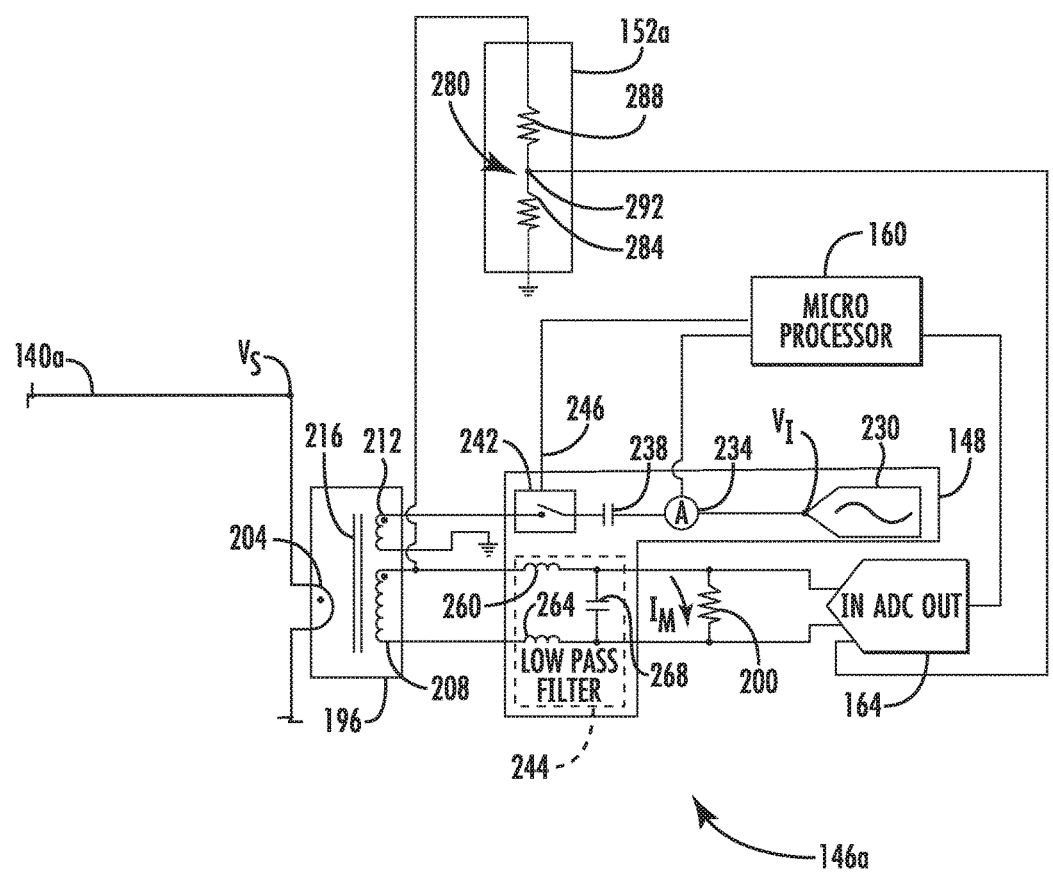
FIG. 2 is a schematic diagram illustrating in further detail the hot socket detection system of the utility meter of FIG. 1.

FIG. 2 illustrates in further detail an exemplary embodiment of the current sensor subsystem 146a and its hot socket detection system 148 apart from other components the meter 124. However, FIG. 2 also shows a portion of the A/D converter 164 and the microprocessor 160 in the context of the current sensor subsystem 146a. In this embodiment, the hot socket detection system 148 is configured to generate an output current signal that is indicative of (i) a permeability of the core 216 of the transformer 196, and (ii) an admittance of the auxiliary secondary winding 212. As explained below, the value of the output current signal is directly related to the temperature of the transformer 196, thus, the hot socket detection system 148 is configurable to monitor the utility meter 124 for the hot socket condition.

In addition to the auxiliary secondary winding 212, the signal source 230, the sensor 234, and low pass filter 244, the hot socket detection system 148 of the embodiment of FIG. 2 includes a capacitor 238, a switch 242, and a low-pass filter 244. The voltage source 230 is configured to inject an injected voltage signal $V_I$ onto the auxiliary secondary winding 212. In one embodiment, the injected voltage signal $V_I$ is an AC signal having a frequency that is much greater than the frequency of the electrical energy generated by the source 104 (identified as source voltage $V_S$ in FIG. 2). For example, the source voltage $V_S$ typically has a frequency of about 50 Hz to 60 Hz, whereas the injected voltage signal $V_I$ has a frequency of about 1,000 Hz to 10 kHz. In one embodiment, the injected voltage signal $V_I$ has a frequency of about 1,575 Hz, such that the injected voltage signal $V_I$ is an interharmonic of a 60 Hz energy source. An interharmonic has a frequency that is not an integer multiple of the frequency of a corresponding reference signal. In this example, 1575 Hz is not an integer multiple of 60 Hz, because 1575 is not evenly divisible by 60.

The sensor 234 in this embodiment is an ammeter operably connected to the auxiliary secondary winding 212 and configured to generate the output current signal, which is based on a current in the auxiliary secondary winding 212. As shown in FIG. 2, the current sensor 234 is connected in series with the auxiliary secondary winding 212. The current sensor 234 is operably connected to the microprocessor 160 to provide the output current signal to the microprocessor 160. The output current signal is an analog or digital signal suitable for processing by the processor 160. Thus, the current sensor 234 may include circuitry for generating a current amplitude signal in analog or digital form. As explained below, the output current signal generated by the current sensor 234 and based on the injected voltage signal $V_I$ is also referred to herein as permeability signal that is indicative of the permeability of the transformer 196.

The capacitor 238 is operably connected in series with the auxiliary secondary winding 212. The capacitor 238 is configured to provide a very high impedance for DC voltage signals and a very low impedance for AC voltage signals having the frequency of the injected voltage signal $V_I$. The capacitor 238 has an exemplary capacitance of one hundred microfarads (100 µF), such that the capacitor 238 has an impedance of approximately 1 ohm (1Ω) in response to an injected voltage signal $V_I$ at 1,575 Hz. However, the capacitance of the capacitor 238 may have any suitable value as required by the frequency of the injected voltage signal $V_I$ and the frequency of the source voltage $V_S$. Moreover, some embodiments of the hot socket detection system 148 do not include the capacitor 238.

The switch 242 is operably connected in series with the auxiliary secondary winding 212 and includes a control line 246 that is electrically connected to the microprocessor 160. In response to receiving an electronic close signal from the microprocessor 160 on the control line 246, the switch 242 is configured to operate in a closed configuration in which electrical current flows through the auxiliary secondary winding 212. In response to receiving an electronic open signal from the microprocessor 160 on the control line 246, the switch 242 is configured to operate in an open configuration in which electrical current is prevented from flowing in the auxiliary secondary winding 212. Thus, the output current signal generated by current sensor 234 is generated only when the switch 242 is operating in the closed configuration. In one embodiment, the microprocessor 160 is configured to intermittently operate the switch 242 in the closed configuration, such that the switch 242 is closed for a first predetermined time period and is open for a second predetermined time period. An exemplary first predetermined time period is one minute and an exemplary second predetermined time period is five minutes. In other embodiments, the first predetermined time period is from 0.01 seconds to five minutes, and the second predetermined time period is from thirty seconds to half an hour. The state of the switch 242 does not affect operation of the current sensor subsystem 146a. That is, the current sensor subsystem 146a is configured to generate the current measurement signal $I_M$ when the switch 242 is in the closed position and when the switch 242 is in the open position, due at least in part to the low pass filter 244.

The low pass filter 244 is operably connected to the secondary winding 208 of the transformer 196. As shown in FIG. 2, the low-pass filter 244 includes a first inductor 260 and a second inductor 264 connected in series with the secondary winding 208 and a capacitor 268 connected in parallel with the secondary winding 208. The low pass filter 244 is configured to have a very low impedance (for example, less than five ohms) for electrical signals having the frequency of the source voltage $V_S$, and a very high impedance (for example, greater than 50 kΩ) for electrical signals having the frequency of the injected voltage signal $V_I$. Accordingly, the low pass filter 244 is configured to prevent the injected voltage signal $V_I$ from passing through to the burden resistor 200 and the A/D converter 164. The current measurement signal $I_M$ dropped across the burden resistor 200 is not affected by the injected voltage signal $V_I$. An exemplary value of the inductors 260, 264 is approximately 5 millihenry (5 mH) and an exemplary value of the capacitor 268 is approximately 100 microfarads (100 µF). Other suitable values of the inductors 260, 264 and the capacitor 268 may be used in other embodiments.

FIG. 2 illustrates the voltage sensor 152a, which is substantially identical to each other voltage sensor 152b, 152c. The voltage sensor 152a includes circuitry capable or configured to generate a voltage measurement signal representative of each of the voltages on the current coils 140a, 140b, 140c and the circuit paths 154a, 154b, 154c (FIG. 1). The voltage sensor 152a includes a voltage divider 280 electrically connected to the current coil 140a through the transformer 196. The voltage divider 280 includes a first resistor 284 and a second resistor 288 electrically connected in series to the secondary winding 208 of the transformer 196. A node 292 between the first resistor 284 and the second resistor 288 is electrically connected to the A/D converter 164, such that the A/D converter 164 is provided with the voltage measurement signal that is representative of the voltage at the secondary winding 208. Typically, the resistors 284, 288 have the same resistance, such that the voltage dropped across the resistor 284 is equal to half of the voltage at the secondary winding 208. Using a ratio including the resistances of the resistors 284, 288 and another ratio including the number of turns of the secondary winding 208 and the number of turns of the primary winding 204, the metrology unit 156 is configured to convert the voltage measurement signal at the node 292 into a digital voltage value that represents the voltage of the electrical energy applied to the current coil 140a and the circuit path 154a (i.e. at source voltage $V_S$ in FIG. 2).

With reference again to FIG. 1, the metrology unit 152 includes the analog to digital (A/D) converter 164 and the microprocessor 160. The A/D converter 164 is operably coupled to receive the voltage measurement signals from the voltage sensors 152a, 152b, 152c and the current measurement signals from the current sensor subsystems 146a, 146b, 146c. The A/D converter 164 is configured to generate corresponding digital signals that are processed by the microprocessor 160 to generate metering data.

The processor 160 is a microprocessor, microcontroller, controller, or any other suitable circuit(s) configured to generate metering data or consumption data by detecting, measuring, and determining one or more electricity and/or electrical energy consumption values based on electrical energy flowing between the sockets 128, 132, 134. Moreover, the processor 160 may suitably be configured to control the state of the service switch 144 based on the status of the hot socket detection system 148, the billing status of the customer associated with the load 104, and the consumption level of the load, among other factors.

The power supply 170 generates an electrical power output that is suitable for powering at least the voltage source 230, the metrology unit 156, the current sensor 234, the transceiver 184, the display 188, the memory 180, and any other component of the utility meter 124. The power supply 170 is operably coupled to at least one power line (108a as shown in FIG. 1) to generate power therefrom.

The memory 180 is operably coupled to the metrology unit 152 and is configured to store metering data generated by the metrology unit. Additionally, the memory 180 is configured to store program data for operating the utility meter 124 according to methods 400 and 700 (FIGS. 4 and 7) described below, as well as storing any other electronic data used or generated by the metrology unit 152. The memory 180 is also referred to herein as a non-transitory machine-readable storage medium.

The transceiver 184 is operably coupled to the metrology unit 152 and is configured to send electric data to the source 104 and/or to the remote center 126, and to receive electric data from the source 104 and/or the remote center 126. In one embodiment, the transceiver 184 is a radio frequency ("RF") transceiver operable to send and to receive RF signals. In another embodiment, the transceiver 184 includes an automatic meter reading (AMR) communication module configured to transmit data to an AMR network and/or another suitable device. The transceiver 184 may also be configured for data transmission via the Internet over a wired or wireless connection. In other embodiments, the transceiver 184 is configured to communicate with an external device (not shown) or the source 104 by any of various means used in the art, such as power line communication, telephone line communication, or other means of communication.

The display 188 is operably coupled to the metrology unit 152 and is configured to display data associated with the utility meter 124 in a visually comprehensible manner. For example, the display 188 may be configured to display the metering data generated by the metrology unit 152, the state of the service switch 144 as determined by the monitoring unit 192, the temperature of the transformer 196 as determined by the hot socket detection system 148, and whether or not the utility meter 124 is in the hot socket condition. The display 188 is provided as any desired display device, such as a liquid crystal display unit, for example.

Figure 3:
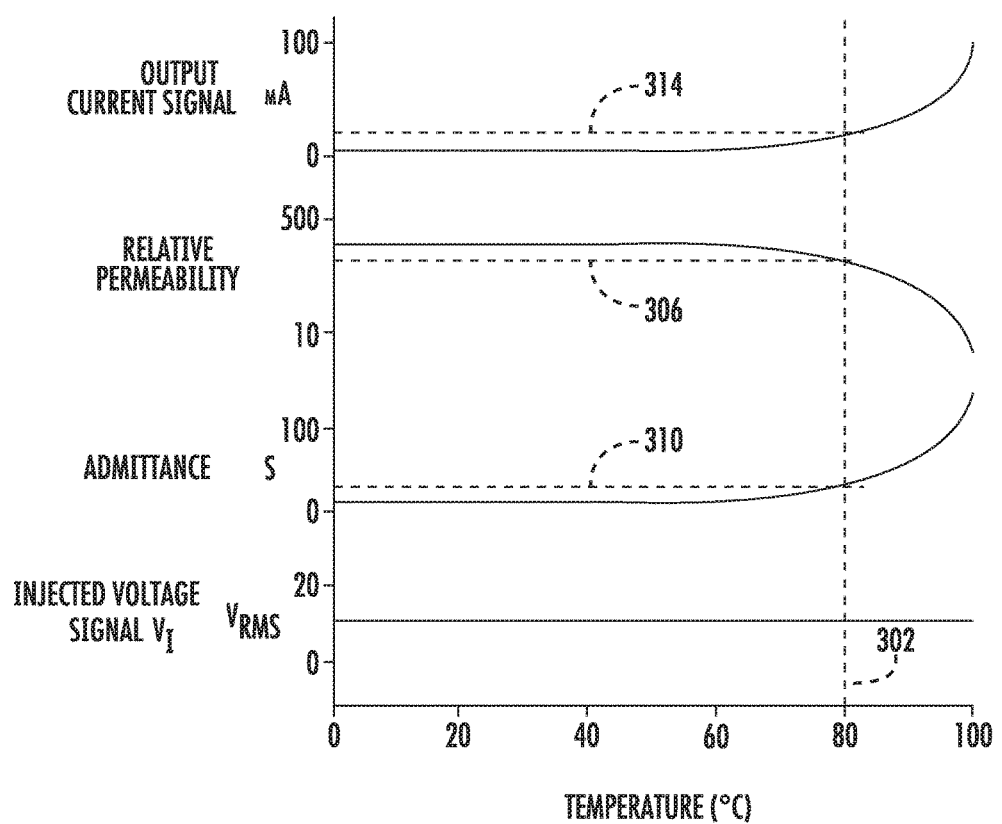
FIG. 3 is a graph illustrating how a current, a permeability, an admittance, and an RMS voltage versus temperature, change when a transformer of the utility meter is heated above a threshold temperature.

With reference to FIGS. 2 and 3, the injected voltage signal $V_I$ generated by the voltage source 230 is followed through the hot socket detection system 148 when the transformer 196 operating at normal operating temperature and when the transformer 196 operating above a threshold temperature 302. At normal operating temperature, for example from 0° C. to the exemplary threshold temperature 302 of 80° C., the injected voltage signal $V_I$ passes through the current sensor 234 basically unchanged due to the extremely low resistance (ideally zero resistance) of the current sensor 234. Next, the capacitor 238 filters any DC component of the injected voltage signal $V_I$. With the switch 242 in the closed configuration, the injected voltage signal $V_I$ is applied to the turns of the auxiliary secondary winding 212. When the core 216 of the transformer 196 is at a normal operating temperature, the voltage source 230 sees a very large reflected load from the primary winding 204 and the secondary winding 208. The very large reflected load corresponds to very low admittance (measured in siemens), as shown in FIG. 3. Accordingly, substantially no current is drawn from the voltage source 230 in response to the injected voltage signal $V_I$ being applied to the auxiliary secondary winding 212, as measured by the current sensor 234. No other source or component is configured to generate a current on the auxiliary secondary winding 212; only the voltage source 230 is configured to generate current on the auxiliary secondary winding 212. In particular, the circuit portion including the capacitor 238, the current sensor 234, and the voltage source 230 is very high impedance at the frequency of the source voltage $V_S$, such that the electrical energy from the source 104 does not result in a current flow through the auxiliary secondary winding 212.

As the temperature of the transformer 196 increases beyond the threshold temperature 302 shown in FIG. 3, the permeability of the core 216 drops, as shown by the plotted relative permeability of the core 216 in FIG. 3. When the permeability drops below a threshold permeability 306, the auxiliary secondary winding 212 is no longer sufficiently magnetically coupled to the primary winding 204 and the secondary winding 208. As a result, the voltage source 230 does not see the reflected load from the primary winding 204 and the secondary winding 208 when the permeability drops below the threshold permeability 306. Instead, the voltage source 230 sees an admittance level that is greater than a threshold admittance 310, and electrical current flows from the voltage source 230 through the current sensor 234. As shown in FIG. 3, in response to the increasing temperature of the transformer 196, the current drawn from the voltage source 230 increases above a threshold current 314 as the permeability of the core 196 falls. The current drawn from the voltage source 230 is thus an indicator of the permeability of the core 216, with a greater magnitude of current corresponding to less permeability and higher temperatures of the transformer 196. Moreover, the level of admittance seen by the voltage source 230 is an indicator of the temperature of the transformer 196, with a greater magnitude of admittance corresponding to higher temperatures of the transformer 196. The threshold temperature 302 typically corresponds to a saturation point of the core 216. When the transformer 196 is heated above the threshold temperature 302, the core 216 does not have sufficient permeability to magnetically couple the primary winding 204 to either of the auxiliary windings 208, 212.

Figure 4:
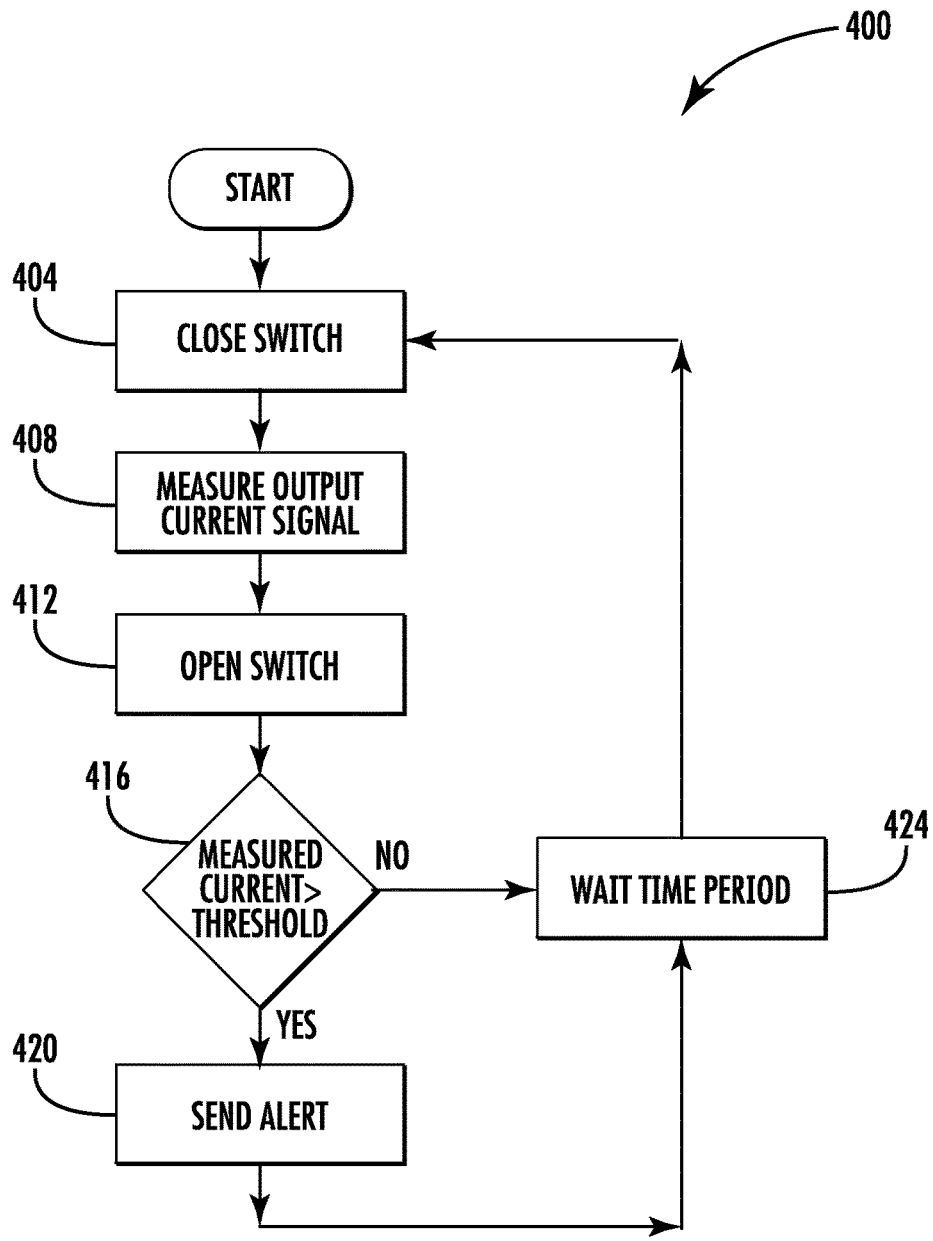
FIG. 4 is a flowchart illustrating an exemplary method of operating the metering system of FIG. 1.

As shown in FIG. 4, the flowchart illustrates a method 400 of operating the utility meter 124 of FIG. 1 to detect the hot socket condition using the hot socket detection system 148. At block 404 the metrology unit 156 closes the switch 242 for the first predetermined time period. When the switch 242 is closed, the injected voltage signal $V_I$, as generated by the voltage source 230, is applied to the auxiliary secondary winding 212. Next, in block 408, the metrology unit 156 processes the output current signal as measured by the current sensor 234. The metrology unit 156 processes the output current signal to determine the magnitude of current, if any, that is flowing through auxiliary secondary winding 212. When the transformer 196 is operating at a temperature less than the threshold temperature 302, the magnitude of the output current signal will be very near zero amperes. However, if the transformer 196 has been heated to a temperature greater than the threshold temperature 302, then the current sensor 234 will generate an output current signal having a non-zero value, as shown in FIG. 3.

The hot socket condition is an event that could cause the temperature of the transformer 196 to increase above the threshold temperature 302. In the hot socket condition, micro-arcing between the arms 138 of the sockets 128, 132 and the blades 156 generates heat. Since the blades 156 and the current coils 140a, 140b, 140c are formed from metal, the heat passes easily and quickly from the sockets 128, 132 and the blades 152 to the current coils 140a, 140b, 140c. At least a portion of the heated current coils 140a, 140b, 140c is mechanically connected to a corresponding transformer 196 of the current sensor subsystems 146a, 146b, 146c. Thus, an elevated temperature of the transformer 196 is a reliable and accurate indicator of an elevated temperature of the blades 156 and the sockets 128, 132. For at least this reason, the metrology unit 156 monitors the temperature of the transformer 196 in order to detect the hot socket condition.

In block 412 the metrology unit 156 causes the switch 242 to enter the open configuration to stop injecting the injected voltage signal $V_I$. Next, in block 416, the metrology unit 156 compares the magnitude of the output current signal to the threshold current 314. Additionally or alternatively, the metrology unit 156 divides the magnitude of the output current signal by the voltage level of the injected voltage signal to arrive at an admittance as seen by the voltage source 230. The admittance is compared to the threshold admittance level 310.

As shown in block 420 if the magnitude of the output current signal is greater than the threshold current 314 and/or if the admittance is greater than the threshold admittance 310, then metrology unit 156 sends a hot socket detection signal to the remote center 126. The hot socket signal is an indication that the utility meter 124 may be experiencing, or is about to experience, the hot socket condition, because the metrology unit 156 has determined that the temperature of at least one of the transformers 196 is greater than the threshold temperature 302 and that the permeability of the transformer 196 has fallen below the threshold value 306.

In response to receiving the hot socket signal, the remote center 126 may send an electronic shut down signal to the utility meter 124 that causes the service switch 144 to enter the open configuration. When the service switch 144 enters the open configuration, electrical service to the load 112 is interrupted and current stops flowing through the current coils 140a, 140b, 140c. The cessation of current stops any micro-arcing between the sockets 128, 132 and the blades 156, thereby causing the temperature of the transformer 196, the sockets 128, 132 and the entire utility meter 124 to fall. Additionally or alternatively, the remote center 126 may also send the hot socket signal or another electric signal to a technician, so that the technician can determine if physical inspection or other remedial action is needed. In some embodiments, detection of a potential hot socket condition by the hot socket detection system 148 may not result in disruption of electrical service to the load 112.

Monitoring the temperature of the transformer 196 is an accurate way to determine if the utility meter 124 is experiencing the hot socket condition. The transformer 196 is one of the first components to show the temperature rise associated with the hot socket condition, because, at least in some embodiments, the transformer 196 is in direct thermal and electrical contact with the sockets 128, 132. Moreover, the transformer 196 is typically located in an isolated location of the utility meter 124 that is not subject to temperature changes resulting from solar loading of the utility meter 124. That is, the temperature of the transformer 196 is largely unaffected by sunlight striking the utility meter 124.

Next, in block 428 the metrology unit 156 waits for the second predetermined time period to elapse before beginning the method 400 again at block 404.

In block 420, if the output current signal is less than the threshold current 314, then, the hot socket signal is not generated, because the hot socket detection system 148 has determined that the utility meter 124 is not experiencing the hot socket condition. Thus, in block 424, the metrology unit 156 waits for the second predetermined time period before beginning the method 400 again at block 404 to continue to monitor the temperature of the utility meter 124. The switch 242 is open during the second predetermined time period.

Figure 5:
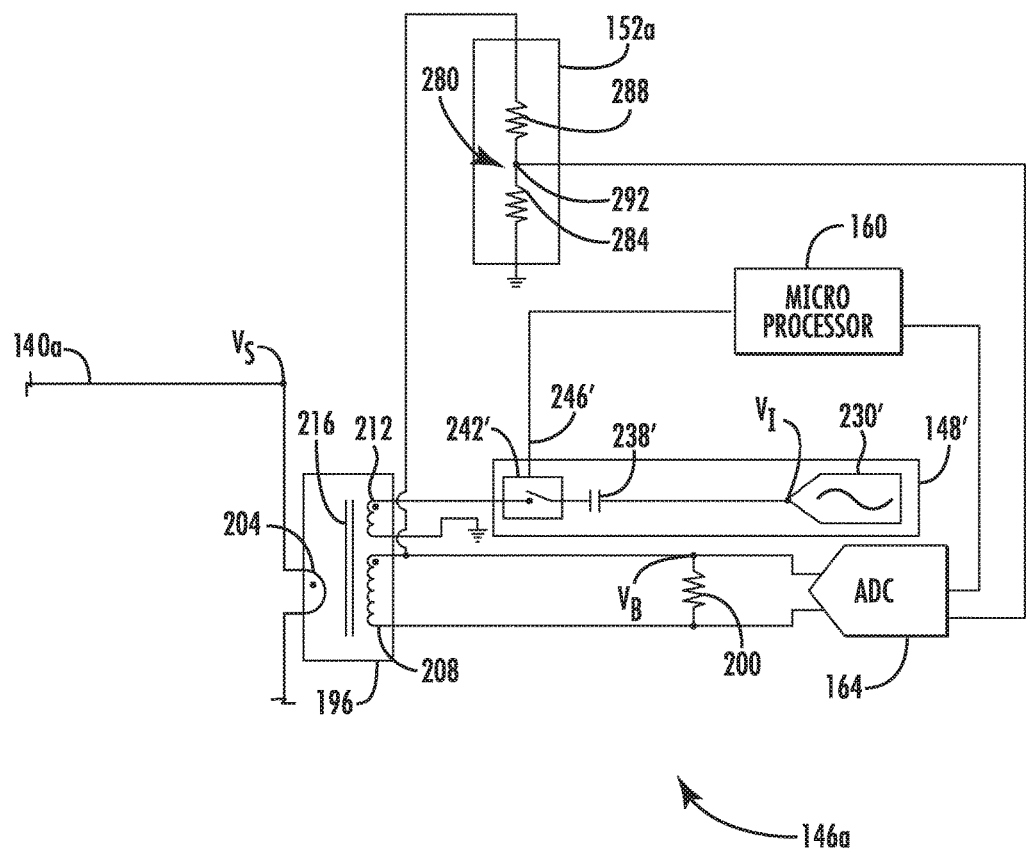
FIG. 5 is a schematic illustrating the structure of another exemplary hot socket detection system associated with the utility meter of FIG. 1.

FIG. 5 illustrates another embodiment of the hot socket detection system 148'. The differences between the hot socket detection system 148 of FIG. 2 and the hot socket detection system 148' of FIG. 5 are described below. The elements that are the same in FIGS. 2 and 5 include the same reference numerals. The hot socket detection system 148' includes a voltage source 230', a capacitor 238', and a switch 242'. The voltage source 230' is configured to inject an injected voltage signal $V_I$ onto the auxiliary secondary winding 212. In one embodiment, the injected voltage signal $V_I$ is an AC signal having a frequency that is much greater than the frequency of the electrical energy generated by the source 104. For example, the injected voltage signal $V_I$ has a frequency of about 1,575 Hz and is an interharmonic of a 60 Hz energy source, such as the source 104.

The capacitor 238' is operably connected in series with the auxiliary secondary winding 212. The capacitor 238' is configured to provide a very high impedance for DC voltage signals and a very low impedance for AC voltage signals having the frequency of the injected voltage signal $V_I$. The capacitor 238' has an exemplary capacitance of one hundred microfarads (100 μF). However, the capacitance of the capacitor 238' may have any suitable value as required by the frequency of the injected voltage signal $V_I$ and the frequency of the source voltage $V_S$. Moreover, some embodiments of the hot socket detection system 148' do not include the capacitor 238'.

The switch 242' is operably connected in series with the auxiliary secondary winding 212 and includes a control line 246' that is electrically connected to the microprocessor 160. In response to receiving a close signal from the microprocessor 160 on the control line 246', the switch 242' is configured to enter a closed configuration in which electrical current flows through the auxiliary secondary winding 212. In response to receiving an open signal from the microprocessor 160 on the control line 246', the switch 242' is configured to enter an open configuration in which electrical current is prevented from flowing in the auxiliary secondary winding 212. In one embodiment, the microprocessor 160 is configured to intermittently close the switch 242', such that the switch 242' is closed for a first predetermined time period and is open for a second predetermined time period. An exemplary first predetermined time period is one minute and an exemplary second predetermined time period is five minutes. In other embodiments, the first predetermined time period is from 0.01 seconds to five minutes, and the second predetermined time period is from thirty seconds to half an hour.

Figure 6:
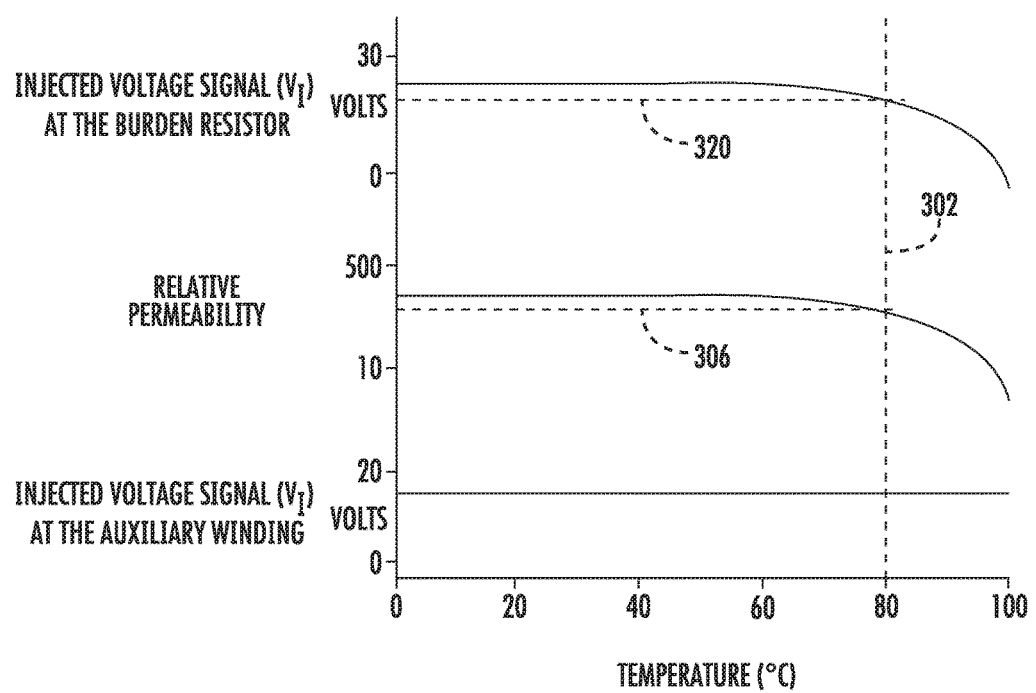
FIG. 6 is a graph illustrating a first RMS voltage, a permeability, and a second RMS voltage versus temperature, the graph further illustrates the change in values that occurs when a transformer of the utility meter is heated above a threshold temperature.

With reference to FIGS. 5 and 6, the injected voltage signal $V_I$ generated by the voltage source 230' is followed through the hot socket detection system 148' when the transformer 196 is operating below the threshold temperature 302 and when the transformer 196 is operating above a threshold temperature 302. With the switch 242' in the closed configuration the injected voltage signal $V_I$ passes through the capacitor 238' and is applied to the turns of the auxiliary secondary winding 212. When the transformer 196 is below the threshold temperature 302, the permeability of the core 216 causes the primary winding 204, the secondary winding 208, and the auxiliary secondary winding 216 to be magnetically coupled. Therefore, the injected voltage signal $V_I$ is magnetically coupled from the auxiliary secondary winding 212 to the primary winding 204 and then from the primary winding 204 to the secondary winding 208. The magnitude of the injected voltage signal $V_I$ is typically scaled based on the number of turns of the windings 204, 208, 212; thus, the magnitude of the scaled injected voltage signal at the secondary winding 208 is typically different from the magnitude of the injected voltage signal $V_I$ at the auxiliary secondary winding 212.

With the injected voltage signal $V_I$ magnetically coupled to the secondary winding 208, the scaled injected voltage signal is detected by the A/D converter 164 as a voltage drop across the burden resistor 200. Thus, the scaled injected voltage signal as dropped across the burden resistor 200 is a permeability signal indicative of a permeability of the transformer 196. Since, in most cases, electrical energy from the source 104 (i.e. source voltage $V_S$) is flowing through the current coil 140a and the primary winding 204, a voltage from the current measurement signal is also dropped across the burden resistor 200. Thus, the voltage dropped at the burden resistor 200 (burden voltage $V_B$) is a combination of a voltage drop from the current measurement signal plus a voltage drop from the scaled injected voltage signal. To ensure that the voltage drops from both the current measurement signal and the scaled injected voltage signal are identifiable in a corresponding digital signal, the A/D converter 164 samples the burden voltage $V_B$ at at least twice the frequency of the injected voltage signal $V_I$ (i.e. typically about 3,150 Hz).

Next, the A/D converter 164 sends the digital signal corresponding to the sampled burden voltage $V_B$ to the microprocessor 160, which is configured to determine the magnitude of the current measurement signal and the magnitude of the scaled injected voltage signal. To determine the magnitude of the current measurement signal, the microprocessor 160 applies a Fourier transform, for example, to the digital signal corresponding to the burden voltage $V_B$. The resulting frequency domain data are processed to determine the magnitude of the data at the frequency of the source voltage $V_S$, which corresponds to the magnitude of the current measurement signal. To determine the magnitude of the scaled injected voltage signal, the microprocessor 160 determines the magnitude of the frequency domain data at the frequency of the injected voltage signal $V_I$. Since the injected voltage signal $V_I$ is selected as an interharmonic of the source voltage $V_S$, the source voltage $V_S$ and harmonics thereof typically have no effect on the magnitude of the digital signal corresponding to the burden voltage $V_B$ at the frequency of the injected voltage signal $V_I$. Any other suitable approach may also be used to determine the magnitude of the current measurement signal and the scaled injected voltage signal.

When the transformer 196 is operating at a temperature that is greater than the threshold temperature 302, the injected voltage signal $V_I$ is not magnetically coupled to the primary winding 204 or the secondary winding 208, due to the drop in magnetic permeability that occurs when the core 216 is heated above the threshold temperature 302. The lack of magnetic coupling is detected by the metrology unit 156 when the voltage level of the scaled injected voltage signal at the burden resistor 200 falls below a threshold value 320. When the transformer 196 is heated sufficiently above the threshold temperature 302, the metrology unit 156 is not able to detect the injected voltage signal $V_I$ on the secondary winding 208, because the injected voltage signal $V_I$ is not magnetically coupled thereto.

Figure 7:
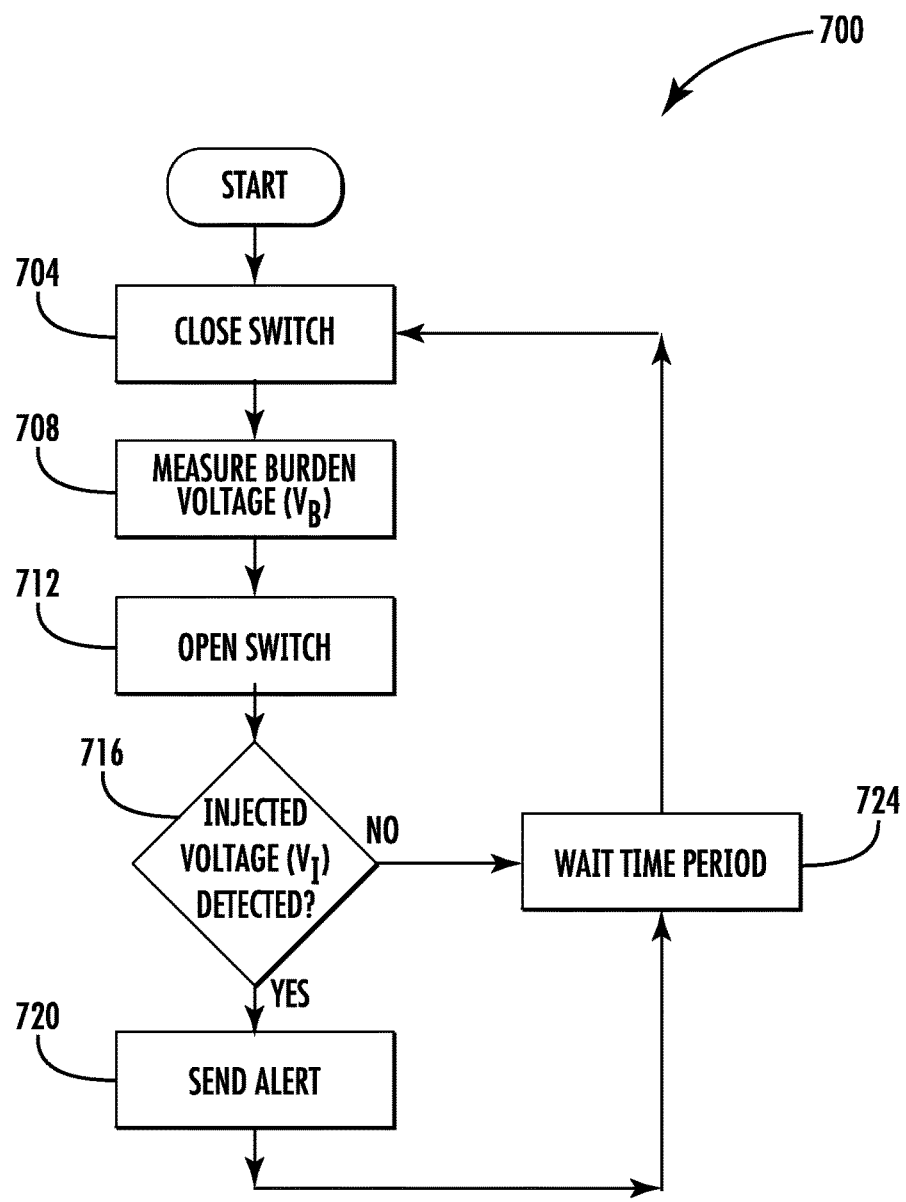
FIG. 7 is a flowchart illustrating an exemplary method of operating the metering system of FIG. 1 with the hot socket detection system of FIG. 5.

As shown in FIG. 7, the flowchart illustrates a method 700 of operating the utility meter 124 of FIG. 1 to detect the hot socket condition using the hot socket detection system 148' of FIG. 5. In block 704, the metrology unit 156 closes the switch 242' for the first predetermined time period. When the switch 242' is closed, the injected voltage signal $V_I$, as generated by the voltage source 230', is applied to the auxiliary secondary winding 212. Next, in block 708, the metrology unit 156 causes the A/D converter 164 to measure and process the burden voltage $V_B$ dropped across the burden resistor 200. In block 712, the metrology unit 156 opens the switch 242' after the A/D converter 164 has measured the burden voltage $V_B$.

In block 716, the metrology unit 156 processes the digital signal corresponding to the burden voltage $V_B$ generated by the A/D converter 164 to determine if the scaled injected voltage signal $V_I$ is present. As described above, under normal operating conditions (i.e. the temperature of the transformer 196 is less than the threshold temperature 302), the metrology unit 156 detects the scaled injected voltage signal flowing through the burden resistor 200, thereby indicating that magnetic coupling is present between the windings 204, 208, 212 of the transformer 196 and that the temperature of the transformer 196 is below the threshold temperature 302. However, if the transformer 196 has been heated to a temperature greater than the threshold temperature 302, then the metrology 156 will either (i) not detect the scaled injected voltage signal in the digital signal corresponding to the burden voltage $V_B$, or (ii) the detected magnitude of the scaled injected voltage signal will be below the threshold value 320.

As shown in block 720, if the injected voltage signal $V_I$ is not present or has too low of a magnitude, then the metrology unit 156 sends a hot socket signal to the remote center 126. The hot socket detection signal is an indication that the utility meter 124 may be experiencing, or is about to experience, the hot socket condition, because the metrology unit 156 has determined that the temperature of transformers 196 is greater than the threshold temperature 302 and that the permeability of the core 216 is less than the threshold value 306. Next, in block 724 the metrology unit 156 waits for a predetermined time period to elapse before beginning the method 700 again at block 704.

Considering block 716, if the injected voltage signal $V_I$ is detected in the burden voltage $V_B$, then, the hot socket signal is not sent and in block 724, the metrology unit 156 waits for the predetermined time period to elapse before beginning the method 700 again at block 704. Detection of the injected voltage signal $V_I$ indicates that the transformers 196 are operating below the threshold temperature 302 and that the utility meter 124 is likely not experiencing the hot socket condition.

In another embodiment of the hot socket detection system 148, the output of the current sensor 234 is connected to an input of a comparator (not shown). A reference voltage source is connected to another input of the comparator. The output of the comparator is connected to the microprocessor 160. The magnitude of the reference voltage source is configured to correspond to the threshold current 314. When the magnitude of the output current signal generated by the current sensor 234 exceeds the magnitude of the reference voltage source, the comparator generates an output signal indicating that the temperature of the transformer 196 is greater than the predetermined temperature 302 and that the permeability of the transformer 196 has fallen below the threshold value 306.

While the disclosure has been illustrated and described in detail in the drawings and foregoing description, the same should be considered as illustrative and not restrictive in character. It is understood that only the preferred embodiments have been presented and that all changes, modifications, and further applications that come within the spirit of the disclosure are desired to be protected.

What is claimed is:

1. An arrangement for use in a utility meter comprising:
    a transformer including a primary winding, a first secondary winding, and a second secondary winding;
    a voltage source configured to generate a voltage signal and operably connected to provide the voltage signal to the first secondary winding, the generated voltage signal having a corresponding current formed at least in part by an impedance defined in part by a permeability of the transformer;
    a sensor operably connected to sense a signal on the first second winding or the second secondary winding and configured to generate a permeability signal indicative of the corresponding current based on the sensed signal; and
    a processor operably connected to the sensor and configured to generate a hot socket detection signal responsive to the permeability signal indicating that the permeability of the transformer has fallen below a threshold value;
    wherein the sensor includes a current sensor operably connected to the first secondary winding, and the permeability signal is an electrical current sensed by the current sensor; and
    wherein the voltage signal is a first voltage signal that has a first frequency, a second voltage signal is supplied to the primary winding and has a second frequency, and the first frequency is greater than the second frequency.

2. The arrangement as claimed in claim 1, further comprising a switch operably connected in series with the first secondary winding.

3. The arrangement as claimed in claim 2, wherein the switch has a conductive state and a non-conductive state, and wherein the sensor is configured to generate the permeability signal only when the switch is in the conductive state.

4. The arrangement as claimed in claim 3, wherein the processor is operably configured to cause the switch to periodically alternate between the non-conductive states and the conductive state in an ongoing manner.

5. The arrangement as claimed in claim 3, wherein the processor is further configured to intermittently operate the switch in the conductive state.

6. The arrangement as claimed in claim 1, further comprising: a low pass filter operably connected to the second secondary winding and configured to block passage of the voltage signal.

* * * * *